(12) United States Patent
Kusserow et al.

(10) Patent No.: US 11,603,286 B2
(45) Date of Patent: Mar. 14, 2023

(54) METHOD AND DEVICE FOR DETERMINING AN OPERATING STATE OF AN ELEVATOR SYSTEM

(71) Applicant: Inventio AG, Hergiswil (CH)

(72) Inventors: Martin Kusserow, Lucerne (CH); Reto Tschuppert, Lucerne (CH); Pascal Joel Moser, Ried bei Kerzers (CH)

(73) Assignee: INVENTIO AG, Hergiswil NW (CH)

( * ) Notice: Subject to any disclaimer, the term of this patent is extended or adjusted under 35 U.S.C. 154(b) by 1238 days.

(21) Appl. No.: 15/747,479

(22) PCT Filed: Jul. 13, 2016

(86) PCT No.: PCT/EP2016/066658
§ 371 (c)(1),
(2) Date: Jan. 25, 2018

(87) PCT Pub. No.: WO2017/016876
PCT Pub. Date: Feb. 2, 2017

(65) Prior Publication Data
US 2018/0215578 A1    Aug. 2, 2018

(30) Foreign Application Priority Data
Jul. 29, 2015 (EP) .................................... 15178768

(51) Int. Cl.
*B66B 1/30* (2006.01)
*B66B 5/00* (2006.01)
*G01R 31/327* (2006.01)

(52) U.S. Cl.
CPC .......... *B66B 5/0031* (2013.01); *B66B 5/0025* (2013.01); *G01R 31/3274* (2013.01)

(58) Field of Classification Search
USPC ........................................................ 187/393
See application file for complete search history.

(56) References Cited

U.S. PATENT DOCUMENTS 4,930,604 A * 6/1990 Schienda .............. B66B 5/0025
187/393
5,247,140 A * 9/1993 Iwasa ........................ H02P 3/04
187/288

(Continued)

FOREIGN PATENT DOCUMENTS

CN    2041309 U    7/1989
CN    1290647 A    4/2001

(Continued)

*Primary Examiner* — Christopher Uhlir
(74) *Attorney, Agent, or Firm* — William J. Clemens; Shumaker, Loop & Kendrick, LLP

(57) ABSTRACT

A method and a device for determining an operating state of an elevator system include determining a current/time profile of a current supplied to the elevator system via a power supply line, identifying at least one current profile segment of the current/time profile, and deriving a current profile pattern of the identified current profile segment. The operating state of the elevator system is determined based on comparing the current profile pattern to at least one reference pattern. The method and the device may also be easily used by personnel without electrical training and may be used in elevator systems that are not known in detail.

20 Claims, 3 Drawing Sheets

12 SENSOR ELEMENT
14 STORAGE DEVICE
16 CONTROLLER
18 COMMUNICATION DEVICE
20 ENERGY SOURCE
22 ENERGY STORAGE UNIT

(56) References Cited

U.S. PATENT DOCUMENTS

| | | | | |
|---|---|---|---|---|
| 5,557,546 | A * | 9/1996 | Fukai | B66B 5/0006 |
| | | | | 702/185 |
| 5,637,841 | A * | 6/1997 | Dugan | B66B 1/30 |
| | | | | 187/291 |
| 5,864,474 | A * | 1/1999 | Jang | H02J 3/32 |
| | | | | 307/64 |
| 7,503,435 | B2 * | 3/2009 | Tyni | B66B 13/22 |
| | | | | 187/391 |
| 7,556,127 | B2 * | 7/2009 | Ohira | B66B 5/0031 |
| | | | | 187/247 |
| 9,837,860 | B2 * | 12/2017 | McCarthy | H02J 50/50 |
| 9,938,115 | B2 * | 4/2018 | Gewinner | B66B 5/0031 |
| 2003/0217894 | A1 | 11/2003 | Perala et al. | |
| 2014/0166407 | A1 * | 6/2014 | Sonnenmoser | B66B 1/2408 |
| | | | | 187/276 |

FOREIGN PATENT DOCUMENTS

| | | |
|---|---|---|
| CN | 104176576 A | 12/2014 |
| WO | 2008068375 A1 | 6/2008 |

* cited by examiner

12 SENSOR ELEMENT
13 SENSOR ELEMENT
14 STORAGE DEVICE
16 CONTROLLER
18 COMMUNICATION DEVICE
20 ENERGY SOURCE
22 ENERGY STORAGE UNIT

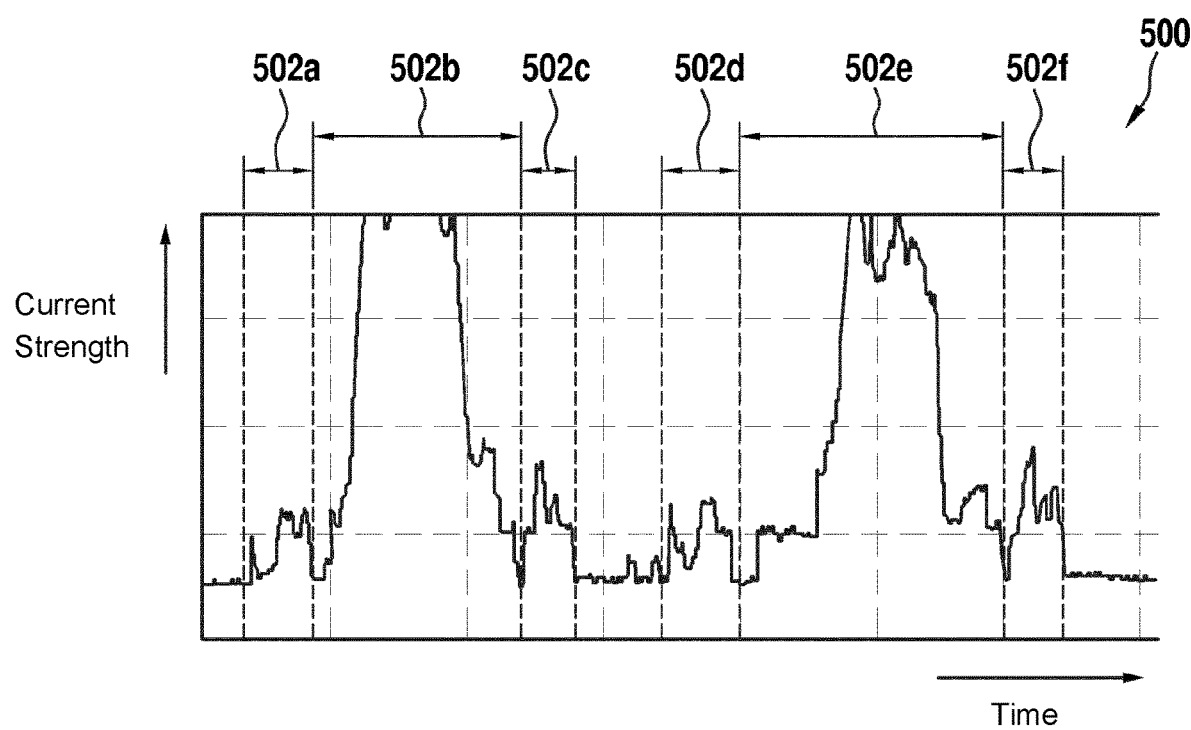

METHOD AND DEVICE FOR DETERMINING AN OPERATING STATE OF AN ELEVATOR SYSTEM

FIELD

The invention relates to elevator systems in general. The invention relates in particular to a method and to a device for determining an operating state of an elevator system. Moreover, the invention relates to a computer program product for implementation on a programmable device as well as a computer-readable medium that can store such a computer program product of this type.

BACKGROUND

As a rule, elevator systems have a plurality of electrical consumers, such as, for instance, a drive, e.g. an electrical machine, for a car of the elevator system that makes it possible to move the car between floors of a building. Further, elevator systems may have at least one drive for at least one door of the elevator system and/or a safety circuit that may have a plurality of safety switches switched in series and that may be used to ensure that the car of the elevator system may travel only when the doors are closed.

A function and/or state of an individual electrical consumer of elevator system, especially an operation and/or activity or inactivity of the specific consumer, may be monitored with various sensors, such as, for example, optical and/or electronic sensors. Such monitoring of individual consumers may be associated with quite complex assembly and/or with significant costs for installation and maintenance of the elevator system.

WO 2008/068375 A1 describes a method and a system for monitoring a state of safety switches of a safety circuit for an elevator, wherein the state is determined based on a measured current strength of a current flowing through the safety circuit.

There may be a need for a comprehensive monitoring system, which monitoring system is cost-effective to produce and may be easily retrofitted, for monitoring components and electrical consumers of an elevator system and/or for determining operating states of the elevator system, wherein the monitoring system may be provided in the form of a method and a device that executes the method.

SUMMARY

According to a first aspect of the invention, a method for determining an operating state of an elevator system, especially an operating state of individual components and/or individual electrical consumers of the elevator system, is suggested. Components and/or electrical consumers of the elevator system may be, for example, a drive for a car, one or a plurality of drives for one or a plurality of doors for the elevators system, or a safety circuit having at least one safety switch.

According to one embodiment of the invention, the method includes a step of determining a current/time profile of a current supplied to the elevator system via a power supply line of the elevator system and a step of identifying at least one current profile segment of the detected current/time profile. Further, the method has a step of deriving a current profile pattern of the identified current profile segment and a step of determining the operating state of the elevator system based on comparing the current profile pattern to at least one reference pattern.

The current/time profile may be determined using a direct and/or indirect measurement, determination, and/or ascertainment of a current strength supplied to the elevator system via the power supply line as a function of time. The current/time profile may thus denote a temporal current profile. Further, the step of determining the current/time profile may comprise determining individual and/or a plurality of phases of a current supplied to the elevator system via the power supply line. The current may be, in particular, a power supply, for instance a three-phase power supply, for the elevator system.

In general, the term operating state may denote a function, activity or inactivity, elevator system-specific events, and/or an operation of the elevator system and/or of individual electrical consumers of the elevator system.

The current profile segment of the detected current/time profile may denote one or a plurality of intervals of the current/time profile. The current profile segment may also denote the entire current/time profile determined over a certain time period. The current profile segment may be identified, for example, via a start time, an end time, and/or a time period of the current profile segment. Correspondingly, the step of identifying the current profile segment may have a step of establishing and/or determining the start time, the end time, and/or the time period of the specific current profile segment.

In general, the current profile pattern derived from the current profile segment may characterize and/or denote a profile of the current in the entire and/or in only part of the current profile segment. For instance, the current profile pattern may have, depict, and/or characterize at least one characteristic of the current/time profile in the current profile segment, such as in particular a maximum, a minimum, a peak, a flank, a rise, a drop, and/or a gradient of the current/time profile.

The reference pattern used for comparing to the current profile pattern may be stored in a storage device, for instance. In addition, it is possible for only a portion of the reference pattern to be stored in the storage device, and the reference pattern may be reconstructed based on the stored portion, for example by scaling, weighting, interpolation, and/or extrapolation.

Ideas for embodiments of the invention may be considered to be based, inter alia, on the ideas and findings described below.

Individual electrical consumers and components of the elevator system may have a current consumption that is characteristic for the specific consumer in a specific operating state of the electrical consumer or elevator system. One possible operating state of the elevator system may be, for example, upward travel of the car, wherein a current consumption to be used by the drive for the car for the upward travel as a function of time may have similarities or characteristics independent of a load conveyed with the car. According to the invention, such characteristics may be stored in the form of a reference pattern, e.g. in a storage device. Thus, a plurality of reference patterns may be stored in the memory, wherein each of the reference patterns may be associated with an operating state of at least one electrical consumer of the elevator system.

According to the invention, during the operation of the elevator car the current strength of the current supplied to the elevator system and/or components or electrical consumers of the elevator system via the power supply line may be determined, measured, and/or ascertained as a function of time. A current profile segment may be ascertained, selected, and/or identified from the determined current/time profile.

At least one characteristic may be derived, determined, and/or ascertained from the current profile segment as a current profile pattern. The current profile pattern may then be compared to one reference pattern stored in the storage device, a plurality of reference patterns stored in the storage device, or all of the reference patterns stored in the storage device. Based on the comparison, a reference pattern may be selected that may be the most similar to and/or may essentially match the determined current consumption or the current profile pattern derived from the current/time profile. Since each reference pattern itself may be associated with a specific operating state of the elevator system or with a specific operating state of a specific electrical consumer of the elevator system, it is possible to deduce the operating state of the elevator system from this. In other words, the operating state of the elevator system, and thus also the operating state of an individual consumer of the elevator system, may be advantageously determined indirectly using a measurement of a differential current consumption and by comparing the current consumption to reference patterns.

Moreover, using the inventive method, it is possible to continuously control and/or monitor, without personnel, a functionality of the elevator system, and a malfunction of the elevator system may be detected or identified, for instance, from a deviation of the determined current profile pattern from the reference pattern. At the same time, an individual electrical consumer that may be faulty, such as, for example, a drive for a door, may be determined. This may then simplify maintenance of the elevator system. A total failure, for instance due to the outage of the power supply to the elevator system, may also be detected automatically. Thus, overall, failures and malfunctions of the elevator system may be detected rapidly.

Furthermore, as an option, a value for an operating state parameter associated with an operating state may be stored in a storage device. The operating state parameter may be a counter, for example, the value of which may indicate how often a specific operating state has previously occurred. The operating state parameter may also be an indicator, e.g. a flag, the value of which may indicate the presence or absence of a certain operating state.

By storing in the storage device a value of an operating state parameter associated with the determined operating state, it is furthermore possible to develop statistics about the use of the elevator system. This then permits, for instance, an expected remaining service life of the elevator system and/or individual consumers of the elevator system to be estimated. Thus, overall, failures and malfunctions of the elevator system may be prevented or kept to a minimum.

A second aspect of the invention relates to a device for determining an operating state of an elevator system, wherein the device is embodied to execute the method as described in the foregoing and in the following.

It is understood that features of the method as described in the foregoing and in the following may also be features of the device and vice versa.

A third aspect of the invention relates to a computer program product that has machine-readable instructions that instruct a programmable device, such as, for example, a computer or a programmable control device, to execute the method as described in the foregoing and in the following.

A fourth aspect of the invention relates to a computer-readable medium that has a computer program product stored on it as described in the foregoing and in the following. A computer-readable medium may be, e.g., a diskette, a hard drive, a USB storage device, RAM, ROM, or EPROM. A computer-readable medium may also be a data communication network, such as, for example, the Internet, that permits downloading of a program code.

According to one embodiment of the invention, the current/time profile in the power supply line is determined with at least one sensor element galvanically separated from the power supply line. Firstly, this may have the advantage that temporary power surges and/or overvoltage in the power supply line cannot damage the sensor element, and, secondly, the sensor element can be mounted during operation of the elevator system without it being necessary to interrupt the power supply line for this purpose. In other words, a sensor element galvanically separated from the power supply line may be applied without interrupting a current circuit, which can further reduce installation costs. In addition, attaching the sensor element does not require personnel with special training, for instance training for working with high voltages.

According to one embodiment of the invention, the power supply line comprises a main power supply line to a control cabinet for the elevator system. The power supply line may conduct direct current or alternating current, especially multiphase alternating current, and may supply electrical energy to a plurality of electrical consumers in the elevator system. The current/time profile may be determined on one or a plurality of phases of the power supply line. In particular, the current/time profile may be determined on a phase of the power supply line that may be connected to a drive of a door of the elevator system, so that an operating state of the door may be determined. By determining the power time profile on a main power supply line, it is thus advantageously possible to monitor a plurality of consumers of the elevator system centrally and their operating states may be determined at one location. This may reduce installation costs and/or maintenance costs for the inventive monitoring system. In addition, this does not necessarily make it necessary to modify a control device of the elevator system, so that it is not necessarily required that specially trained personnel perform the installation.

According to one embodiment of the invention, the operating state is determined taking into account elevator-specific exclusion criteria and/or elevator-specific marginal conditions. Possible operating states of the elevator system may be divided or classified, for instance, into classes, at least some of which may be mutually exclusive. For instance, one class of operating states may be an activity of the drive of the car and another class may be an activity of a drive of a door. For technical safety precautions and due to hardware safety precautions for the elevator system, as a rule it is not possible to operate a door during travel by the car. This may then be used as an exclusion criterion when determining an operating state. For instance, if a current profile pattern indicates an activity of the drive of the car, according to the classification of the operating states and the corresponding exclusion criteria the possibility that a drive of the door was active simultaneously may be excluded. Reference patterns that are associated with the operating state of the activity of the door drive may therefore be excluded in such a case and, during the determination of the actual operating state, do not necessarily have to be used or do not necessarily have to be compared to the current profile pattern. Other elevator-specific marginal conditions, such as, for instance, that as a rule the elevator door is closed prior to travel by the car and the elevator door is opened after travel by the car, may also be taken into account during the determination of the operating state. Overall, taking into account elevator-specific exclusion criteria and/or marginal conditions may increase the speed of determining the operating state and enhance the accuracy of this determination.

According to one embodiment of the invention, the current profile pattern has at least one characteristic parameter for a specific operating state. Possible parameters may include, inter alia, a standard deviation of at least some of the current/time profile of a current profile segment, a maximum value for the current, a threshold value of the current, a mean value of the current, a gradient of the current, a number of local maximums or minimums in the current profile segment and/or a (temporal) interval of peaks in the current profile segment. In addition, a value in the frequency range of the current profile segment that may be calculated, for instance, by means of a Fourier or wavelet transform may be taken into account. In addition, the current profile pattern may have, for instance, corresponding variables integrating at least one parameter, such as for instance a current consumer over a specific period of time. The current profile pattern may be, for instance, a vector or a matrix of parameters that may be characteristic of a specific operating state or may be allocated to a specific operating state.

According to one embodiment of the invention, the step of deriving the current profile pattern comprises determining a value of the at least one parameter that is characteristic for the specific operating state. Based on the determination of the value of the at least one parameter, therefore, a meaningful comparison to the reference pattern may be made and thus a reliable determination of the operating state may be made.

According to one embodiment of the invention, the reference pattern has at least one reference parameter that is characteristic for the specific operating state. Analogous to the parameters of the current profile pattern, possible reference parameters may be, inter alia, a standard deviation, a maximum value for the current, a threshold value for the current, a gradient for the current, a number of local maximums or minimums, and/or a (temporal) interval of peaks. In addition, the reference pattern or the corresponding at least one reference parameter may have integral variables, such as, for instance, current consumption over a specific period of time. The reference pattern may be a vector or a matrix of such reference patterns. In other words, the reference pattern may be a list or compilation of reference parameters that are characteristic of the operating state in question.

According to one embodiment of the invention, the specific operating state is determined based on a comparison of the value of the at least one parameter that is characteristic of the specific operating state to a reference value of the at least one reference parameter of the reference pattern. This may advantageously permit reliable and automated determination of the operating state.

According to one embodiment of the invention, the step of deriving the current profile pattern of the current profile segment especially comprises determining a standard deviation, a maximum value, a threshold value, an integral and/or a gradient of the current in the current profile segment. Interval variables, a number of local maximums and minimums, and/or a (temporal) interval of peaks may also be determined. In other words, the parameter that is characteristic for any operating state may be determined and/or calculated for deriving the current profile pattern.

According to another embodiment of the invention, the step of identifying the at least one current profile segment comprises segmenting the detected current/time profile into current profile segments. For instance, the current/time profile may be divided into discrete current profile segments that may denote, for example, time segments or time intervals of the current/time profile. Individual current profile segments may then be associated with individual operating states by comparing them to the corresponding reference patterns. In this way the quality or accuracy of the determination of the operating states may be enhanced. In addition, segmenting and possibly taking into account the exclusion criteria above may also accelerate the determination of the operating states.

According to one embodiment of the invention, the method has another step of selecting a current profile segment that forms the basis for determining a current profile pattern, as reference pattern, and/or a step of storing the current profile pattern as reference pattern in a storage device. Such functions may be relevant in particular for a learning phase for the monitoring system for elevator systems. Because different elevator systems may vary in a system-specific manner in their current consumption, especially their differential current consumption, it may be necessary, e.g. after installing the inventive monitoring system, to store in the storage device system-specific characteristics regarding the current consumption of the elevator system and/or individual consumers in the form of at least one reference pattern. For instance, to this end at least one definable test run of the elevator system could be performed, wherein current profile patterns are determined and may be stored as reference patterns so that during regular operation of the elevator system operating states may be determined based on these reference patterns. The inventive monitoring system may therefore be configured to be self-learning. The monitoring system may also be configured to update the reference patterns stored in the storage device after certain time intervals, for instance to compensate and/or take into account changes in the differential current consumption of the elevator system. Such functions may be initiated and/or executed automatically, using a technician on site, and/or by remote maintenance.

According to one embodiment of the invention, the determined operating state comprises a movement state of a car of the elevator system, a number of floors traveled with the car, a number of complete travel cycles for the car, an operating state of an elevator door, a position of the car, and/or an operating state of a safety circuit of the elevator system. The movement state of the car may be, for example, a stand-by state, a relative and/or absolute stand-by time, a relative and/or absolute travel time, an upward movement, and/or a downward movement. The operating state of the elevator door may be, for example, an open door, a closed door, an opening door, a closing door, and/or a number of door movements. The operating states of the elevator system may be stored, in the form of the operating state parameters, in the storage device, wherein their values may be updated, adapted, and/or modified dynamically during operation of the elevator system.

According to another embodiment of the invention, the device for determining an operating state of an elevator system has at least one sensor element, one storage device, and one controller. The sensor element is embodied to determine the current/time profile of the current supplied to the elevator system via the power supply line of the elevator system. The controller is embodied to identify the at least one current profile segment of the determined current/time profile, to derive the current profile pattern of the identified current profile segment, to compare the current profile pattern to the at least one reference pattern, to determine the operating state of the elevator system based on the comparison, and to store in the storage device a value of at least one operating state parameter associated with the operating state. The device may in particular be a sensor device. The controller may in general be a data processing device, a processor, a logic device, a microcontroller, and/or the like. Further, the device may have, for instance, an analog/digital converter and/or a filter device, for instance a low-pass filter that may be used to filter signals from the sensor element.

According to one embodiment of the invention, the sensor element has an inductive current sensor and/or a Hall sensor. Such sensors may be advantageously applied and/or mounted on the power supply line interruption-free (i.e., without interrupting a current circuit). Further, such sensor elements may be distinguished by low current consumption and a long service life.

According to one embodiment of the invention, the device has a plurality of sensor elements, each of which is embodied to determine a current/time profile of an individual phase of the current supplied to the elevator system via the power supply line.

According to one embodiment of the invention, the device has an additional sensor element, wherein the additional sensor element is embodied to detect a current/time profile of a current in a safety circuit of the elevator system. In this way an operating state of the safety circuit and/or of safety switches for the safety circuit may be determined, as well.

According to one embodiment of the invention, the device further has an energy source for supplying the device with electrical energy.

According to one embodiment of the invention, the energy source has an energy storage unit that is embodied to be charged, at least in part, via a magnetic field produced by current flowing in the power supply line. The energy storage unit may be a rechargeable battery, an accumulator, a capacitor, capacitance, or any other electrical energy storage unit. Mounting of the device may be advantageously simplified by at least partially charging the energy storage unit via the magnetic field of the power supply line, since it is not necessary to wire the device to a power supply line. In particular this means that mounting does not have to be performed by specially trained personnel. The need for intervening in electric currents in the elevator system may also be avoided.

According to one embodiment of the invention, the device further has a communication device for transmitting values of operating states, stored in the storage device, of operating state parameters associated with the elevator system. The communication device may in particular be an interface, for instance a bus interface, to the device. Data may be transmitted, in particular wirelessly, via the communication device. The communication device may furthermore be connected to the Internet in order to permit remote maintenance. The communication device may also have an NFC (near field communication) interface for contactless data transmission, e.g. with a mobile terminal device. For instance, current profile patterns and/or values for associated parameters may be retrieved from the storage device via the communication device. Operating state parameter values may also be retrieved. Reference values for the reference parameters of the reference patterns may also be stored in and/or retrieved from the storage device via the communication device.

Overall it shall be understood that the described steps of the method may be implemented in the device as programmed software modules, functional modules, and/or functions. However, it is also possible for these functional modules to be implemented, entirely or in part, as hardware.

If it is technically possible, but not explicitly stated, combinations of embodiments, both as described in the foregoing and in the following, are also embodiments of the device.

Exemplary embodiments of the invention are described in detail in the following, referring to the enclosed figures.

DESCRIPTION OF THE DRAWINGS

FIG. 5 depicts a current/time profile determined as an example in the context of the method from FIG. 4.

The drawings are only schematic and are not true to scale. The reference numbers used in the figures and their meaning are enumerated in summary form in the list of reference numbers. In principle, identical or similar parts are provided with the same reference numbers.

DETAILED DESCRIPTION

Figure 1:
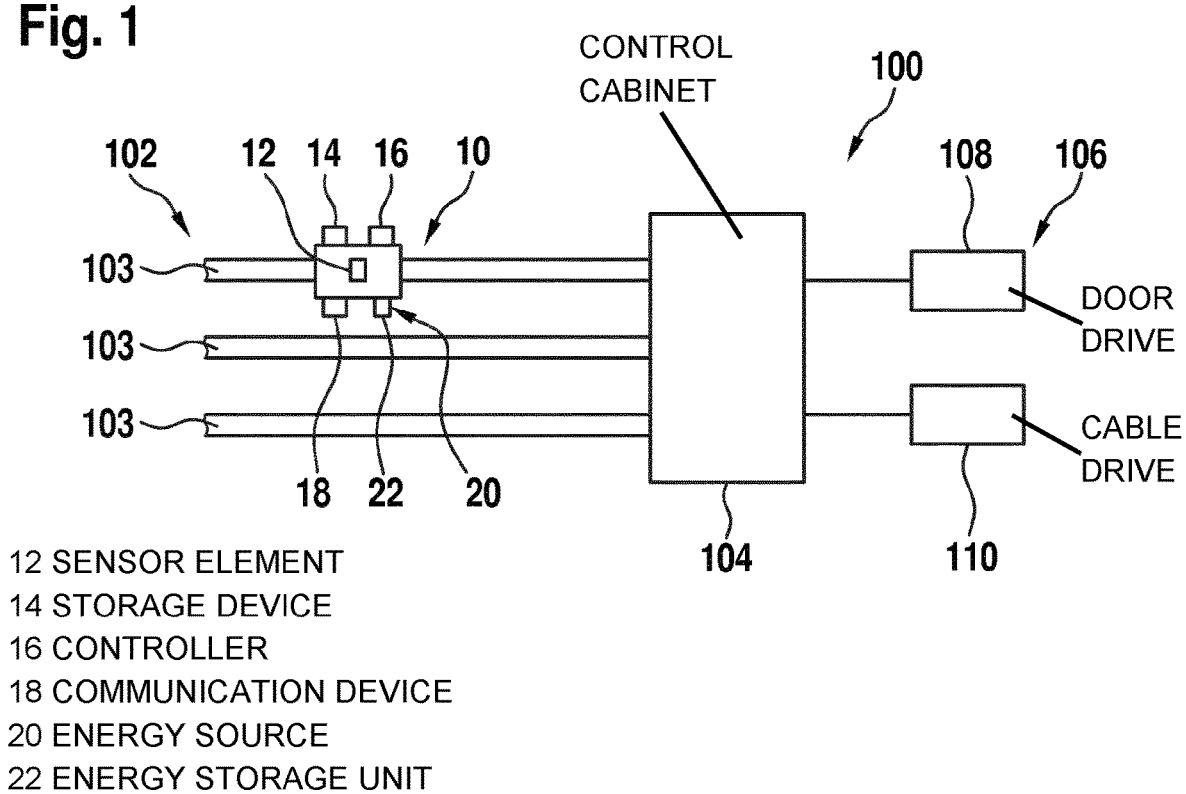
FIG. 1 illustrates a device for determining an operating state of an elevator system according to one embodiment of the invention.

FIG. 1 illustrates a device 10 for determining an operating state of an elevator system 100 according to one embodiment of the invention.

The elevator system 100 has a power supply line 102 that can conduct direct or alternating current. The power supply line 102 may conduct in particular three phases 103 of alternating current. The power supply line 102 may be a main power supply line for the elevator system 100, for example, and be connected, e.g. to a control cabinet 104 of the elevator system 100. Finally, the power supply line 102 may supply power to a plurality of electrical consumers 106 of the elevator system 100. The electrical consumers 106 may each be connected to the control cabinet 104 with electrical lines and have, for instance, a drive for a door or a door drive 108 in the form of an electrical machine. Further, the electrical consumers 106 may have a drive for causing a car of the elevator system 100 to move or a cable drive 110 in the form of another electrical machine. Various other electrical consumers 106 may be operated via the power supply line 102 and via the control cabinet 104, such as, for instance, a cabin operating panel (COP), lighting, displays, etc.

The device 10 for determining an operational state of the elevator system 100 has a sensor element 12. The sensor element 12 is arranged on the power supply line 102 or on a phase 103 of the power supply line 102 and/or is coupled thereto. The sensor element 12 may be attached in particular to the phase 103 via which the door drive 108 is supplied with electrical energy, so that a current supplied to the door drive 108 may be detected with the sensor element 12. The sensor element 12 is galvanically separated from the power supply line 102. For instance, the sensor element 12 may have a Hall sensor or an inductive sensor that may detect, determine, and/or measure, without an electrical connection between the sensor element 12 and the power supply line 102, a current strength supplied via the power supply line 102 to the elevator system 100. In general, the sensor element 12 is embodied to determine a current/time profile 500 (see FIG. 5), i.e., a current strength as a function of time, for the current supplied to the elevator system 100 via the power supply line 102. In other words, the sensor element 12 is embodied to determine, in a time-resolved manner, the current strength supplied to the elevator system 100 in at least one phase 103 of the power supply line 102. To this end, the sensor element 12 may determine the current strength continuously or quasi-continuously at a certain sampling rate, wherein the sampling rate may be between 10 Hz, e.g. at a direct current in the power supply line 102, to a few kHz or higher, so that an alternating current may be determined or sampled with high accuracy, as well.

The device 10 furthermore has a storage device 14 for storing and/or retrieving data, parameters, variables, and the like. For instance, the memory device 14 may have a RAM memory (random access memory), a flash memory, and/or any other type of data storage unit.

The device 10 further has a controller 16. The controller 16 is in particular embodied to process and/or evaluate data determined by the sensor element 12 and/or signals from the sensor element 12, as explained in detail in the foregoing and in the following. To this end, the controller 16 may have a data processing device, a processor, a logic device, a microcontroller, and/or the like.

Further, the device 10 has a communication device 18 that may have an interface via which in particular access to data stored in the storage device 14 may be provided, as explained in detail in the foregoing and in the following. The communication device 18 may have, for instance, a bus interface. The communication device 18 may furthermore be connected to the Internet in order to permit remote maintenance of the device 10. The communication device 18 may also have an NFC (near field communication) interface for contactless data transmission, e.g. with a mobile terminal device.

Further, the device 10 has an energy source 20 for supplying the device 10 with electrical energy, wherein the energy source 20 has an energy storage unit 22 that is embodied to be charged, at least in part, via a magnetic field produced by current flowing in the power supply line 102. The energy storage 22 unit may be a rechargeable battery, an accumulator, a capacitor, capacitance, or any other electrical energy storage unit.

Figure 2:
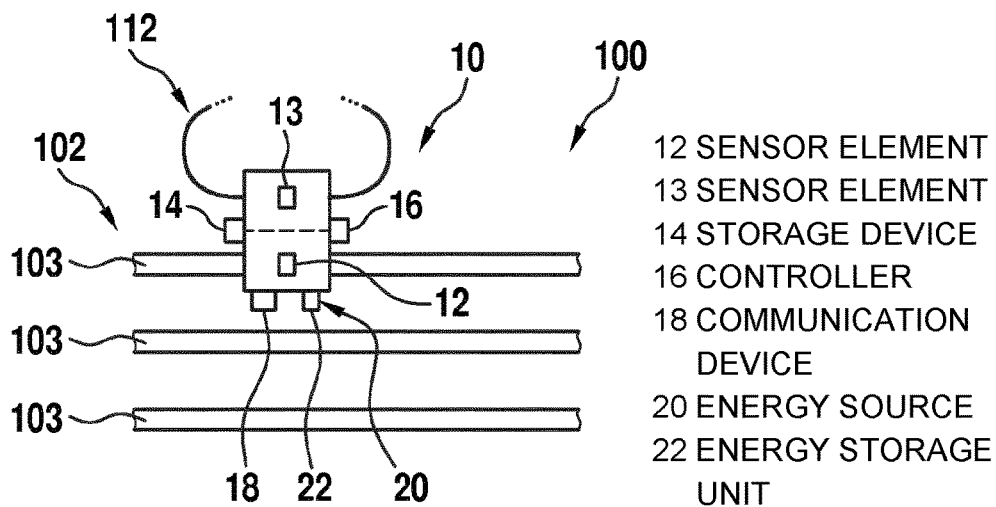
FIG. 2 illustrates a device for determining an operating state of an elevator system according to another embodiment of the invention.

FIG. 2 illustrates a device 10 for determining an operating state of an elevator system 100 according to another embodiment of the invention. If there is no information to the contrary, the device 10 in FIG. 2 may have the same elements and features as the device 10 in FIG. 1. For the sake of better understanding, a few components of the elevator system 100 are not shown in FIG. 2.

In the embodiment illustrated in FIG. 2, the elevator system 100 has a safety circuit 112 that itself may have a plurality of safety switches (not shown) switched in series. For instance, when a door of the elevator system 100 is open and/or when the door drive 108 is operating, at least one of the safety switches may be open, so that simultaneous operation of the car drive 110 may be excluded or prevented.

The device 10 in FIG. 2 has another sensor element 13 that is coupled to the safety circuit 112 and that is designed to determine, detect, and/or measure a current/time profile of a current in the safety circuit 112. The additional sensor element 13 is also galvanically separated from the safety circuit 112 and may have an inductive sensor or a Hall sensor.

Figure 3:
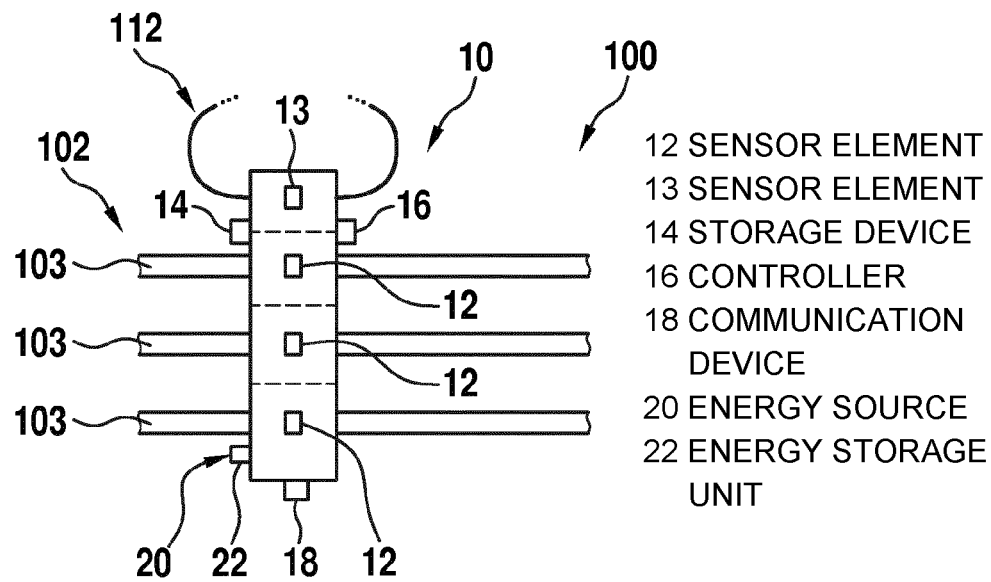
FIG. 3 illustrates a device for determining an operating state of an elevator system according to another embodiment of the invention.

FIG. 3 illustrates a device for determining an operating state of an elevator system 100 according to another embodiment of the invention. If there is no information to the contrary, the device 10 in FIG. 3 may have the same elements and features as the devices 10 in FIG. 1 and FIG. 2. For the sake of better understanding, a few components of the elevator system 100 are not shown in FIG. 3.

In the exemplary embodiment illustrated in FIG. 3, the device 10 has three sensor elements 12, each of which is arranged on one of the three phases 103 of the power supply line 102 and/or is coupled to one phase 103. The sensor elements 12 are each embodied to determine a current/time profile of an individual phase 103 for the current supplied to the elevator system 100 via the power supply line 102.

Figure 4:
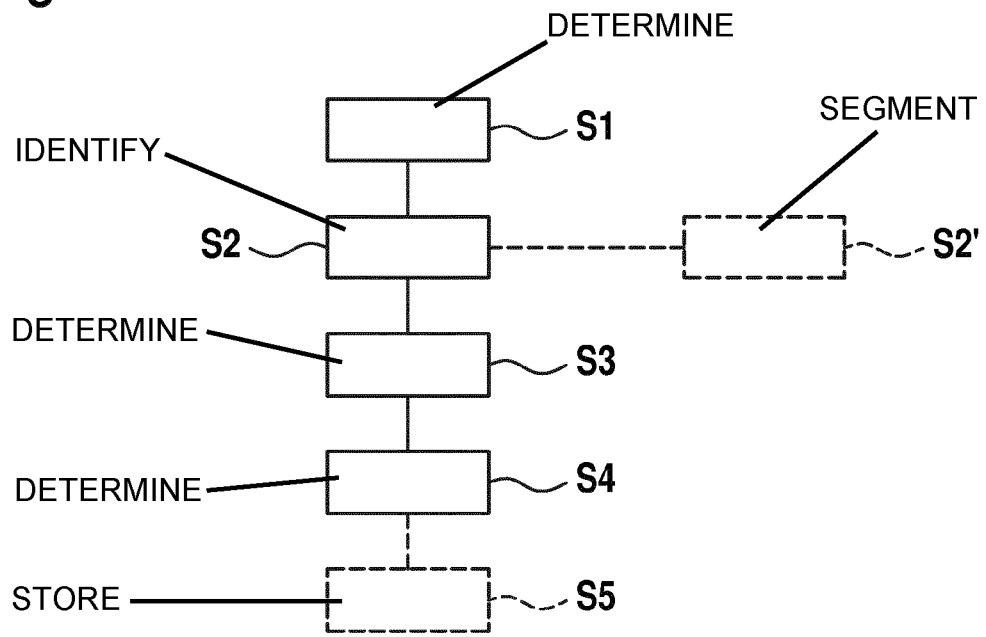
FIG. 4 depicts a flow chart illustrating steps of an inventive method for determining an operating state of an elevator system according to one embodiment of the invention.

FIG. 4 depicts a flow chart illustrating steps of an inventive method for determining an operating state of an elevator system according to one embodiment of the invention. FIG. 5 depicts a current/time profile 500 determined as an example in the context of the method from FIG. 4.

In general, the operating state of the elevator system 100 determined using the inventive method and/or device 10 may comprise an operating state of a car of the elevator system 100, a number of floors traveled with the car, a number of complete travel cycles for the car, an operating state of an elevator door, a position of the car, and/or an operating state of a safety circuit 112 of the elevator system 100. The movement state of the car may be, for example, a stand-by state, a relative and/or absolute stand-by time, a relative and/or absolute travel time, an upward movement, and/or a downward movement. The operating state of the elevator door may be, for example, an open door, a closed door, an opening door, a closing door, and/or a number of door movements.

For determining one of the possible operating states of the elevator system 100, in a first step S1 a current/time profile 500 of the current supplied to the elevator system 100 is determined using the device 10 and in particular using the at least one sensor element 12, 13 of the device 10. The current/time profile 500 identifies the current strength as a function of time, as shown in FIG. 5. The current/time profile 500 thus represents a differential current consumption of the electrical consumers 106 of the elevator system 100. For instance, the sensor element 12, 13 may determine, detect, and/or measure a value of the current strength at a certain sampling rate. The values of the current strength are then stored in the memory device 14, wherein they may also be processed, if necessary, scaled, for instance, by the controller 16.

In another step S2, a current profile segment 502a-f of the current/time profile 500 is identified and/or selected using the device 10 and in particular using the controller 16. The current profile segment 502a-f may be identified, for example, via a start time or a time interval of the current profile segment 500 that may be characterized, for example, using a start time, an end time, and/or a time period for the current profile segment 502a-f. The identified and/or selected current profile segment 502a-f is preferably a range of the current/time profile 500 that may be allocated to one of the possible operating states of the elevator system 100.

The current profile segment 502a-f may be identified directly, for instance by the identification of a range of the current/time profile 500 in which the current strength is greater than a certain resting level. In a step S2', the current/time profile 500 may optionally be segmented, using the device 10, into a plurality of current profile segments 502a-f that may ideally be associated with an operating state of the elevator system 100.

In another step S3, a current profile pattern of the current profile segment 502*a-f* identified and/or selected in step S2 is derived, determined, and/or specified using the device 10 and in particular using the controller 16. The current profile pattern has at least one parameter that is characteristic of each operating state, and in step S3 a value of the at least one parameter characteristic for the specific operating state is determined. Possible parameters of the current profile pattern may include, for example, a standard deviation of a peak, a maximum value, a threshold value, an integral and/or a gradient of the current in the current profile segment 502*a-f*. A number of local maximums and minimums in the current profile segment 502*a-f* and/or a (temporal) interval of peaks in the current profile segment 500 may also be possible parameters of the current profile pattern. Consequently the step S3 may comprise identifying, determining, and/or calculating values of the parameters of the current profile pattern.

Reference patterns are stored in the storage device 14 of the device 10 for actually determining one of the possible operating states of the elevator system 100. Analogous to the current profile patterns, each of the reference patterns has a reference parameter, or a reference value of the reference parameter, that is characteristic for the specific operating state. Possible parameters may include, for example, a standard deviation of a peak, a maximum value, a threshold value, an integral and/or a gradient of the current. A number of local maximums and minimums, and/or a (temporal) interval of peaks may also be stored possible reference parameters in the reference pattern. A reference pattern may be stored in the storage device 14 for each possible operating state of the elevator system. For instance, a reference pattern for upward travel of the car, downward travel of the car, opening of a door, and closing of a door may be stored.

The actual operating state of the elevator system 100 for a current profile segment 502*a-f* is determined in a step S4 based on a comparison of the current profile pattern of one of the current profile segments 502*a-f* to at least one reference pattern stored in the memory device 14. More precisely, in step S4 the values of the parameters of the current profile pattern of the current profile segment 502*a-f* identified in step S2, which parameters were derived in step S3, are compared to the reference values of the reference parameters so that if the values match the reference values within definable tolerance limits, a reference pattern may be determined for the current profile segment 502*a-f* identified in step S2. Once each reference pattern has again been associated with a specific operating state, the operating state of the elevator system 100 may be determined in this manner.

For instance, if the current profile segment 502*a* is identified and/or selected in step S2, the current profile pattern derived in step S3 may have, for example, three peaks, an interval of the peaks, a standard deviation of each peak, and/or an integral of the current strength over the time period of the current profile segment 502*a*. These values may then be compared to the reference values of the reference patterns, wherein the reference pattern for a closing door of the elevator system may be most similar to the current profile pattern. Correspondingly, the operating state of a closing door may then be associated with the current profile segment 502*a*.

Analogously, downward travel of the car may be associated with the current profile segment 502*b*, opening of the door with the segment 502*c*, closing of the door with segment 502*d*, upward travel of the car with the segment 502*e*, and opening of the door with the segment 502*f*.

In principle, in addition to the reference patterns for determining operating states, elevator-specific exclusion criteria may be taken into account, such as, for example, that travel by the car and simultaneous opening or closing of the door is prohibited. This may increase accuracy of the determination of the operating state and may also accelerate a determination of the actual operating state, because, for instance, in step S4 the current profile pattern only has to be compared to the reference patterns that are at issue. Other elevator-specific marginal conditions, such as, for instance, that as a rule the elevator door is closed prior to travel by the car and the elevator door is opened after travel by the car, may also be taken into account during the determination of the operating state.

Corresponding to the operating states determined in step S4, in an optional step S5 a value of an operating state parameter associated with one of the operating states may be stored in the storage device 14. At least one operating status parameter may be stored for each possible operating state of the elevator system. The operating state parameter may be a counter, for example, the value of which may indicate how often a specific operating state has previously occurred. The operating state parameter may also be an indicator, e.g. a flag, the value of which may indicate the presence or absence of a certain operating state.

Further, in certain operating states, such e.g. travel by the car, additional information may also be drawn from the corresponding current profile segment 502*a-f*. For instance, a load conveyed with the car and/or a number of floors traveled may be determined based on the current/time profile 500 in a current profile segment 502*a-f*. Such information may also be stored in the storage device 14 in the form of at least one operating state parameter. For instance, an operating state parameter may be a number of door movements, a number of floors traveled, or a number of travel cycles.

Values of the operating state parameters may be updated, adapted, and/or modified dynamically during operation of the elevator system 100. In particular, the values of the operating state parameters may be retrieved and/or transmitted via the communication device 18. In addition, the reference patterns, for instance, may also be stored in the storage device 14 and/or updated via the communication device 18.

The device 10 may also be configured to be self-learning. For instance, the device 10 may be embodied to select a current profile pattern derived in step S3 as a reference pattern and to store it as a reference pattern in storage device 14. Consequently, the inventive method may have a step for selecting a current profile pattern as the reference pattern and a step for storing this current profile pattern as the reference pattern in the storage device 14.

In summary, embodiments of the method described herein or of an appropriately embodied device are suitable to detect and to monitor operating states within an elevator system in a simple manner. To this end, a current/time profile may preferably be monitored in a main power line and, using patterns occurring therein, about the presence of certain operating states may be deduced. A preferably contactless measuring sensor, i.e. a sensor galvanically separated from the power line, may be arranged on the power line for this purpose. Such a sensor may also be mounted by personnel who do not have a great depth of technical knowledge in field of electricity. In particular, the sensor may also be arranged on elevator systems whose precise manner of electrical functioning is not known, i.e. for which there is no known circuit diagram, for instance. The described method or a device that executes this method may thus be retrofitted on elevator systems and then, possibly after a teaching phase, operating states within the elevator system may be detected and classified using pattern detection in the current/time profile of a power supply for the elevator system.

In addition, it should be noted that "comprising" does not preclude other elements or steps, and "a" or "one" do not preclude a plurality. Furthermore, it should be noted that features or steps that have been described with reference to one of the above embodiments may also be used in combination with other features or steps of other embodiments described above.

In accordance with the provisions of the patent statutes, the present invention has been described in what is considered to represent its preferred embodiment. However, it should be noted that the invention can be practiced otherwise than as specifically illustrated and described without departing from its spirit or scope.

The invention claimed is:

1. A method for determining an operating state of an elevator system, the method comprising the steps of:
   determining a current/time profile of an electrical current supplied to the elevator system via a power supply line of the elevator system, the power supply line supplying the electrical current to a plurality of electrical consumers of the elevator system, the electrical consumers including a cable drive and a door drive;
   identifying at least one current profile segment of the current/time profile;
   deriving a current profile pattern of the at least one current profile segment; and
   determining the operating state of the elevator system based on comparing the current profile pattern to at least one reference pattern.

2. The method according to claim 1 wherein the current/time profile of the current in the power supply line is determined with at least one sensor element galvanically separated from the power supply line.

3. The method according to claim 1 wherein the power supply line is a main power supply line to a control cabinet for the elevator system.

4. The method according to claim 1 wherein the operating state is determined taking into account at least one of elevator-specific exclusion criteria and elevator-specific marginal conditions.

5. The method according to claim 1 wherein the current profile pattern has at least one characteristic parameter for the operating state.

6. The method according to claim 1 wherein the step of deriving the current profile pattern comprises determining a value of at least one parameter that is characteristic for the operating state.

7. The method according to claim 6 wherein the operating state is determined based on a comparison of the value of the at least one parameter that is characteristic for the operating state to a reference value of at least one reference parameter of the at least one reference pattern.

8. The method according to claim 1 wherein the at least one reference pattern has at least one reference parameter that is a characteristic for the operating state.

9. The method according to claim 1 wherein the step of deriving the current profile pattern of the identified at least one current profile segment comprises determining at least one of a standard deviation, a maximum value, a threshold value, a mean value, an integral and a gradient of the current in the at least one current profile segment.

10. The method according to claim 1 wherein the step of identifying the at least one current profile segment comprises segmenting the current/time profile into at least two current profile segments.

11. The method according to claim 1 further comprising at least one of the steps of:
   selecting a current profile segment of the current/time profile as a basis for deriving the current profile pattern as the at least one reference pattern; and
   storing the current profile pattern as a reference pattern in a storage device.

12. The method according to claim 1 wherein the operating state is at least one of a movement state of a car of the elevator system, a number of floors traveled with the car, a number of complete travel cycles for the car, an operating state of an elevator door, a position of the car, and an operating state of a safety circuit of the elevator system.

13. A computer program product having machine-readable instructions stored on a non-transitory computer-readable medium, which instructions, when executed by a programmable device, cause the programmable device to execute carry out the steps of the method according to claim 1.

14. A device for determining an operating state of an elevator system comprising:
   at least one sensor element;
   a storage device;
   a controller connected to the at least one sensor element and the storage device;
   wherein the at least one sensor element determines a current/time profile of electrical current supplied to the elevator system via a power supply line of the elevator system, the power supply line supplying the electrical current to a plurality of electrical consumers of the elevator system, the electrical consumers including a cable drive and a door drive; and
   wherein the controller identifies at least one current profile segment of the current/time profile, derives a current profile pattern of the at least one current profile segment, compares the current profile pattern to at least one reference pattern, determines the operating state of the elevator system based on the comparison, and stores in the storage device a value of at least one operating state parameter associated with the operating state.

15. The device according to claim 14 wherein the at least one sensor element has at least one of an inductive current sensor and a Hall sensor.

16. The device according to claim 14 including a plurality of the at least one sensor elements, each of the sensor elements determining a current/time profile of an individual phase for the electrical current supplied to the elevator system via the power supply line.

17. The device according to claim 14 including an additional sensor element that detects a current/time profile of an electrical current in a safety circuit of the elevator system.

18. The device according to claim 14 including an energy source for supplying the device with electrical energy, wherein the energy source includes an energy storage unit that is adapted to be charged by a magnetic field produced by the electrical current flowing in the power supply line.

19. The device according to claim 14 including a communication device for transmitting values of operating state parameters stored in the storage device, the operating state parameters being associated with operating states of the elevator system.

20. The method according to claim 1 including determining an operating state of a selected one of the electrical consumers from the operating state of the elevator system.

* * * * *